United States Patent
Hung et al.

(10) Patent No.: US 7,359,237 B2
(45) Date of Patent: Apr. 15, 2008

(54) HIGH WRITE SELECTIVITY AND LOW POWER MAGNETIC RANDOM ACCESS MEMORY AND METHOD FOR FABRICATING THE SAME

(75) Inventors: Chien-Chung Hung, Hsinchu (TW); Ming-Jer Kao, Hsinchu (TW); Yung-Hsiang Chen, Hsinchu (TW); Shu-En Li, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/846,663

(22) Filed: May 17, 2004

(65) Prior Publication Data

US 2005/0135149 A1    Jun. 23, 2005

(30) Foreign Application Priority Data

Dec. 19, 2003    (TW) ............... 92136333 A

(51) Int. Cl.
*G11C 11/15* (2006.01)

(52) U.S. Cl. ............ 365/173; 365/129; 365/158

(58) Field of Classification Search ......... 365/173, 365/158, 171, 38, 129, 213; 257/421, 330; 438/3, 6

See application file for complete search history.

(56) References Cited

U.S. PATENT DOCUMENTS

| | | | |
|---|---|---|---|
| 5,587,943 A * | 12/1996 | Torok et al. ............... 365/158 |
| 5,640,343 A * | 6/1997 | Gallagher et al. .......... 365/171 |
| 6,541,815 B1 * | 4/2003 | Mandelman et al. ....... 257/330 |
| 6,639,830 B1 * | 10/2003 | Heide ......................... 365/158 |
| 6,642,595 B1 | 11/2003 | Hung et al. |
| 6,815,290 B2 * | 11/2004 | Lin et al. .................... 438/257 |
| 6,855,564 B2 * | 2/2005 | Cha .............................. 438/3 |
| 6,865,109 B2 * | 3/2005 | Covington .................. 365/173 |
| 6,955,926 B2 * | 10/2005 | Chen et al. ..................... 438/3 |
| 7,266,486 B2 * | 9/2007 | Nahas .......................... 703/13 |
| 2002/0149962 A1 * | 10/2002 | Horiguchi ................... 365/173 |
| 2003/0185065 A1 * | 10/2003 | Ishikawa .................... 365/200 |
| 2004/0061156 A1 * | 4/2004 | Cha ........................... 257/295 |
| 2005/0030786 A1 * | 2/2005 | Deak .......................... 365/158 |
| 2005/0051839 A1 * | 3/2005 | Faltermeier et al. ........ 257/330 |
| 2005/0127416 A1 * | 6/2005 | Han et al. ................... 257/293 |

FOREIGN PATENT DOCUMENTS

JP    20012737759    *    5/2001

* cited by examiner

*Primary Examiner*—Anh Phung
*Assistant Examiner*—Dang Nguyen
(74) *Attorney, Agent, or Firm*—Birch, Stewart, Kolasch & Birch, LLP

(57) ABSTRACT

A low-power magnetic random access memory (MRAM) with high write selectivity is provided. Write word lines and pillar write word lines covered with a magnetic material are disposed in an zigzag relation, solving the magnetic interference problem generated by cells adjacent to the pillar write word line in the magnetic RAM with the pillar write word line form. According to the disclosed structure, each of the cells has a smaller bit size and a lower write current. This effectively reduces the power consumption of the MRAM.

11 Claims, 3 Drawing Sheets

HIGH WRITE SELECTIVITY AND LOW POWER MAGNETIC RANDOM ACCESS MEMORY AND METHOD FOR FABRICATING THE SAME

This Non-provisional application claims priority under 35 U.S.C. § 119(a) on Patent Application No(s). 092136333 filed in Taiwan on Dec. 19, 2003, the entire contents of which are hereby incorporated by reference.

BACKGROUND OF THE INVENTION

1. Field of Invention

The invention relates to a magnetic random access memory (MRAM) and, in particular, to an MRAM with high write selectivity and low power consumption.

2. Related Art

Magnetic random access memory (MRAM) is nonvolatile memory. Using its magnetic resistance property to record information, it has the advantages of non-volatility, high densities, high access speeds, and anti-radiation.

The basic operation principles of the MRAM are the same as storing data on a hard disk drive (HDD). Each bit of data is determined by its magnetization orientation to be either 0 or 1. The stored data are permanent until being modified by an external magnetic field.

When data is read from the MRAM, an electrical current has to flow to a selected magnetic tunnel junction (MTJ) cell. The resistance value determines the numerical value of the data. When writing in data, a common method uses two wires (a bit line and a write word line) to induce a magnetic field at the selected cell, thereby changing the magnetization orientation of the magnetic material at the position and the data thereof.

The MTJ cell between the bit line and the write word line has a stack structure of multi-layer magnetic metal materials. The structure basically contains a soft magnetic layer, a nonmagnetic conductor or tunnel barrier, and a hard magnetic layer. Whether the magnetization orientations of the two layers of ferromagnetic materials are parallel or anti-parallel determines whether the stored datum is 1 or 0.

As memory devices are becoming smaller, the MRAM starts to encounter the electron migration problem because the write-in electrical current needed to change data approaches the current density limit that can be carried by a metal wire. To solve the problem, the U.S. Pat. No. 6,642,595 discloses a memory structure. As shown in FIG. 1, the MTJ cell formed from a magnetic tunnel junction cell 10 has a lower electrode 20 below it. An insulator 30 is below the lower electrode 20. The magnetic tunnel junction cell 10 is connected to the bit line 50 via a middle metal pillar 70. The write word line is composed of an upper layer write word line 40A and a lower layer write word line 40B. The induced total magnetic is further enhanced by the pillar write word lines (PWWL's) 60 on both sides of the magnetic tunnel junction cell 10. The PWWL's near the MTJ can produce a larger magnetic field focused on the MTJ. Therefore, the threshold current needed by the MRAM is reduced. Nonetheless, this structure has a problem. If the PWWL's point in the normal direction, they will produce a negative contribution to the magnetic field on the adjacent MTJ, enlarging the device size. Moreover, to avoid the interference of the write word line on MTJ's that are not selected, a better design for increasing the MRAM write selectivity is to let the magnetic field produced by the write word line pass through as few MTJ's as possible.

SUMMARY OF THE INVENTION

In view of the foregoing, a primary objective of the invention is to provide a magnetic random access memory (MRAM) with high write selectivity and low power consumption. The invention reduces the write current required by the MRAM, thereby reducing the power consumption during the write period thereof.

The disclosed structure can eliminate the magnetic interference problem of the write word lines on adjacent MTJ's. This increases the write selectivity of the MRAM.

To achieve the above-mentioned objective, the disclosed MRAM has a plurality of MTJ cells, a plurality of bit lines, a plurality of middle metal pillars, and a plurality of PWWL's. Each MTJ cell is comprised of a magnetic tunnel junction cell and a lower electrode. Changing the magnetization orientation of the magnetic tunnel junction cell determines the memory state. Each bit line provides the read and write current channels for the corresponding MTJ cell. Each middle metal pillar connects the MTJ cell and the bit line. Each write word line is comprised of an upper layer write word line, a lower layer write word line and a pair of PWWL's, providing the write current channel for the MTJ cell. This increases the induced magnetic field at the MTJ cell. The PWWL's of the adjacent MTJ cells are disposed in an interleaving fashion (zigzag pattern as shown in the FIG. 2). Aside from the part of the PWWL facing the surrounding of the magnetic tunnel junction cell, the rest is covered by a sidewall keeper. The sidewall keeper covering the PWWL's of the disclosed MRAM can reduce the write current required by the MRAM.

The invention has to add a photo mask process after the PWWL process. Furthermore, the disclosed sidewall keeper structure confines the magnetic flux on the MTJ so that adjacent MTJ's are not affected by the magnetic field produced by the PWWL's. The write selectivity of the MRAM is thus greatly increased.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

To reduce negative interference of adjacent PWWL's on a MTJ, the invention employs the photo mask to arrange a PWWL and its PWWL's of write word lines with the same electrical currents flow in an interleaving fashion.

Figure 1:
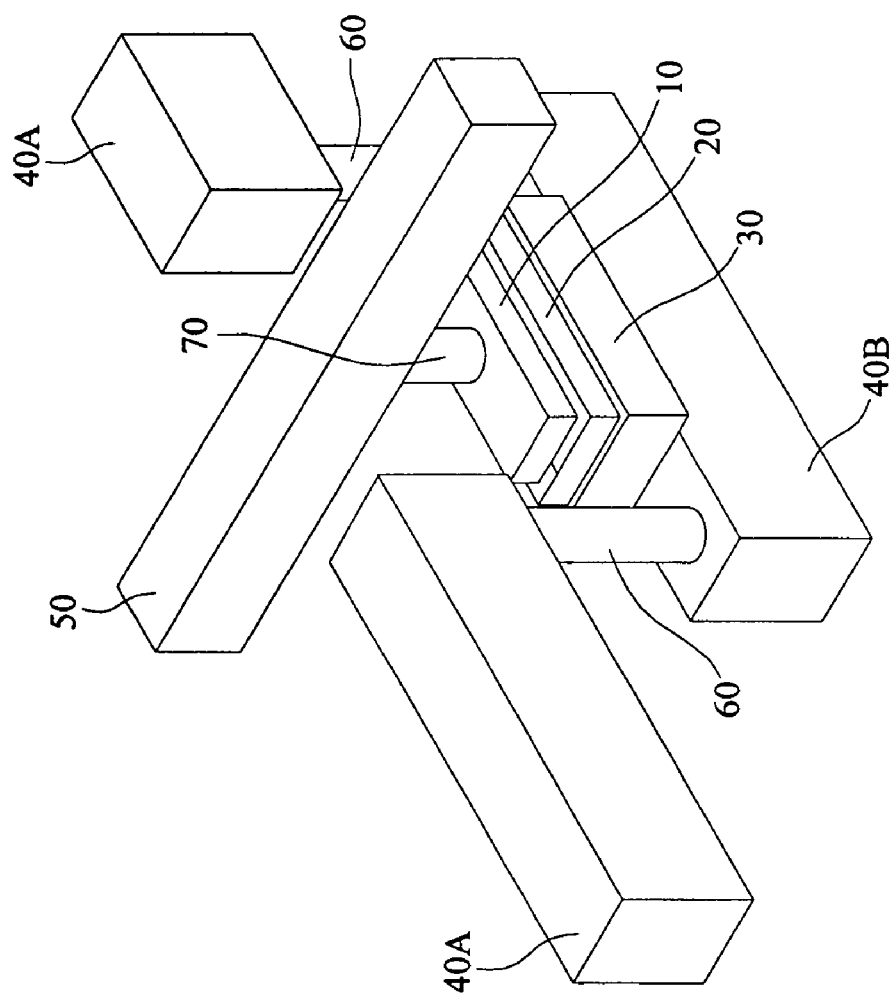
FIG. 1 is a MRAM with PWWL's disclosed in the prior art.
Figure 2:
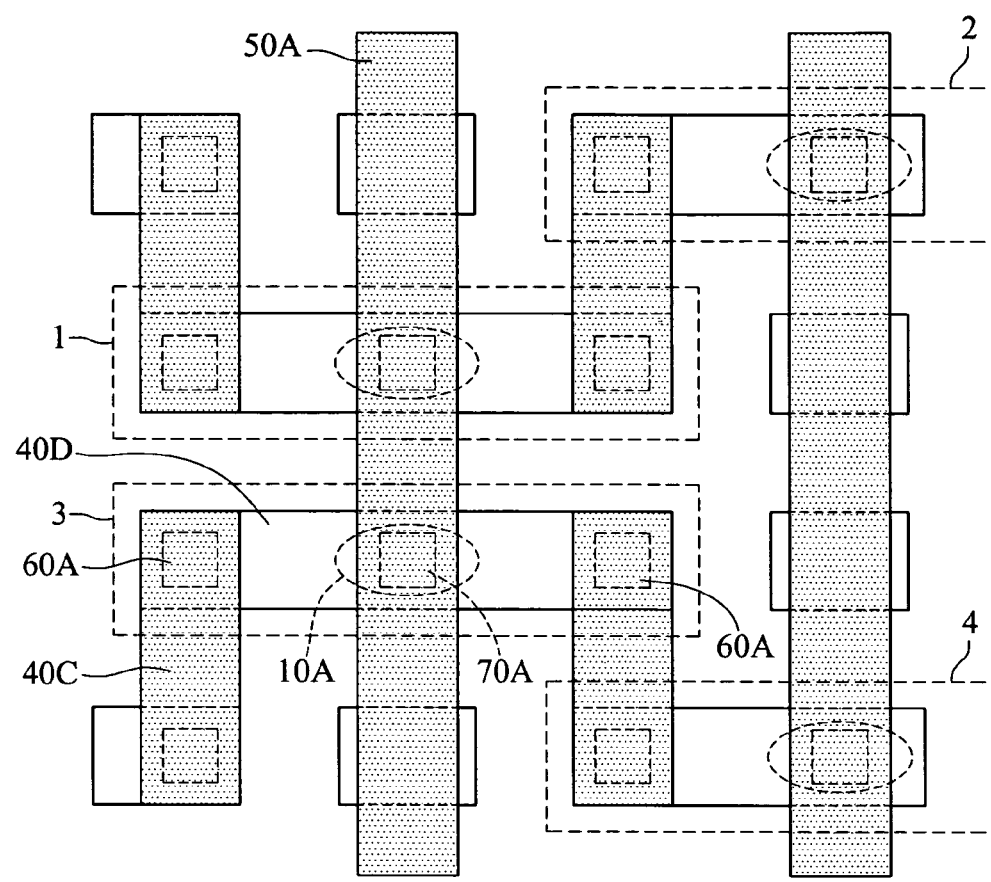
FIG. 2 is a schematic layout of the MRAM with PWWL's according to the invention.

FIG. 2 shows the mask layout of a MRAM. As shown in the drawing, it contains magnetic memory cells 1, 2, 3, 4. The magnetic memory cell 1 and the magnetic memory cell 2 are next to each other; likewise, the magnetic memory cell 3 and the magnetic memory cell 4 are next to each other. Each memory unit has a magnetic tunnel junction cell 10A, an upper layer write word line 40C, a lower layer write word line 40D, a PWWL 60A, and a middle metal pillar 70A. The memory unit 1 and the memory unit 3 are controlled using the bit line 50A. The magnetic tunnel junction cell 10A further contains a lower electrode (not shown) to form a MTJ. The magnetic memory cell 1 and the magnetic memory cell 2 are affected under the current-induced magnetic field of the same write word line. Likewise, the magnetic memory cell 3 and the magnetic memory cell 4 are affected under the current-induced magnetic field of the same write word line.

The layout in the prior art is to arrange the magnetic memory cells next to one another. However, such a layout will result in interference of adjacent PWWL's on a MTJ. With reference to FIG. 2, the PWWL and its adjacent PWWL's of the write word lines with the same current flow in a zigzag fashion, eliminating the negative magnetic field produced by the adjacent PWWL's. Such a zigzag layout renders a smaller bit size and a smaller write current.

Figure 3:
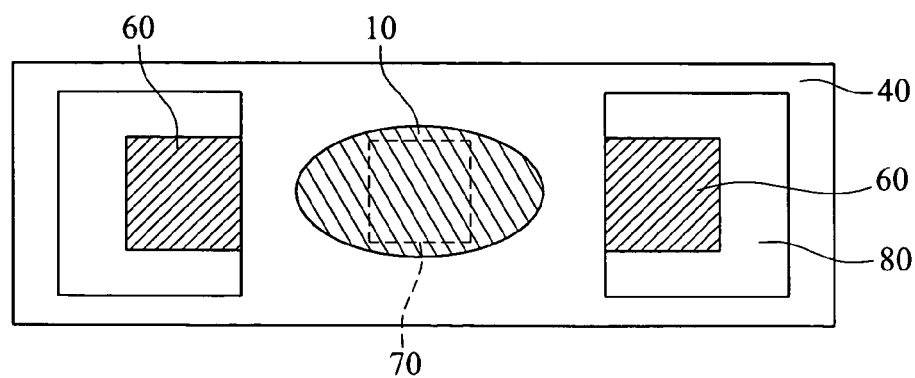
FIG. 3 is a schematic view of a PWWL covered with a sidewall keeper.

With further reference to FIG. 3, aside from the part of the PWWL 60 that faces the magnetic tunnel junction cell 10, the rest is covered by a sidewall keeper 80 formed from a magnetic material with high permeability. Once an electrical current flows through the PWWL, the magnetic flux will be confined within the sidewall keeper without spreading all over the space. This reduces the magnetic interference of a PWWL on adjacent MTJ's.

Generally speaking, the PWWL covered with a sidewall keeper can increase the induced magnetic field to two times that of uncovered ones, while the write current can be roughly reduced by a factor of two.

In the following, we describe the manufacturing process of the MRAM disclosed in the invention. After forming the lower electrode and the MTJ's, there is a step of forming a via as the PWWL and the middle metal pillar. It is normally performed using single-time photolithography alignment, etching, copper plating, and chemical mechanical polishing (CMP).

Afterwards, a new photo mask, as shown in FIG. 3, is used to block the surface facing the MTJ, with a pattern to prevent light from going through. The etching process performed subsequently has a very large etching selection ratio for copper; thus, the PWWL's made before can be preserved during the etching process.

The next step is to fill a material with high permeability, generally a permally or Ferri magnet. Its top surface is removed by etching back or CMP. Finally, an upper electrode is formed on the MRAM to be the bit line.

Figure 4:
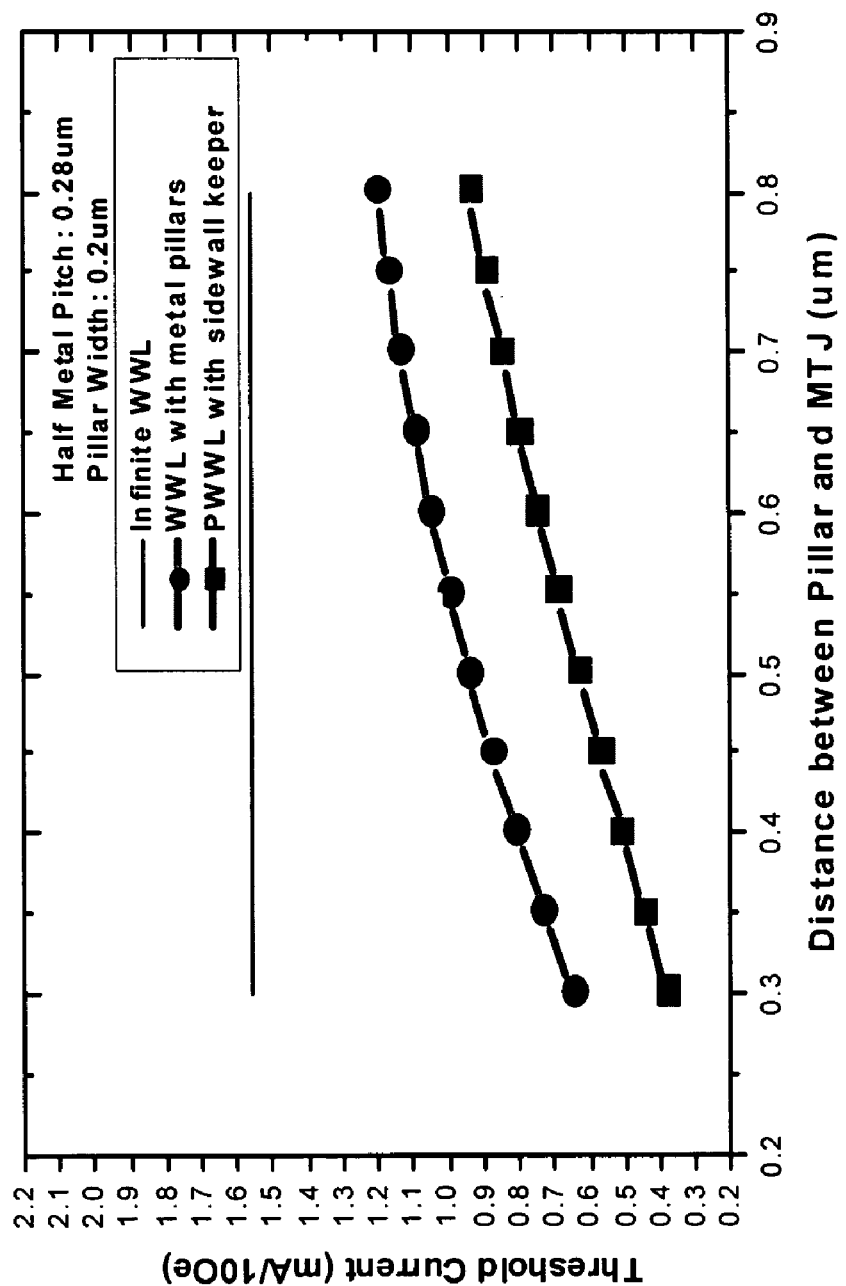
FIG. 4 is a figure of simulated data for the disclosed MRAM with PWWL's.

The sidewall keeper structure effectively converge the magnetic flux generated by the PWWL's on a specific MTJ. A simulation result is shown in FIG. 4. The horizontal coordinate is the distance between the PWWL and the magnetic tunnel junction cell; the vertical coordinate is the write current. The curve with circular black dots is the write current required for PWWL's. The curve with rectangular blocks is the write current required for PWWL's covered with sidewall keepers. From the figure, it is appreciated that the PWWL design can lower the write current by about a factor of two. After covering the PWWL with a sidewall keeper, the write current is further lowered to one-fourth of that in the prior art. Therefore, the disclosed MRAM structure does not only reduce the write power consumption, but also greatly increase the write selectivity of memory.

The disclosed MRAM adopts zigzag write word lines so that it has a smaller bit size and a lower write current. This can resolve the magnetic interference problem of adjacent PWWL's on a MTJ.

Moreover, the disclosed vertical sidewall keeper can prevent magnetic interference of a PWWL on its adjacent MTJ. Therefore, the adjacent MTJ's will not incorrectly change their memory states. The write selectivity of the MRAM is thus enhanced. Using the structure, the write current of the MRAM with PWWL's can be lowered to about one-fourth of that in the prior art, consequently reducing the power consumption of the MRAM.

Certain variations would be apparent to those skilled in the art, which variations are considered within the spirit and scope of the claimed invention.

What is claimed is:

1. A magnetic random access memory (MRAM) with high write selectivity and low power consumption comprising a plurality of magnetic memory units, each of the magnetic memory units comprises:
   a lower layer write word line extending along a first direction;
   a plurality of upper layer write word lines extending along a second direction substantially perpendicular to the first direction;
   a plurality of pillar write word lines connecting the upper layer write word lines to the lower layer write word line to provide write current channels for the magnetic memory unit;
   a magnetic memory cell having a magnetic tunnel junction, the magnetic memory cell made of materials comprising a magnetic material in the MRAM and whose memory state is determined by changing its magnetization orientation; and
   a plurality of sidewall keepers, each of which covers a corresponding pillar write word line except for the part facing the magnetic memory cell, wherein each of the sidewall keeper confines magnetic flux on the magnetic tunnel junction so that adjacent magnetic tunnel junction cells are not affected by the magnetic field produced by the pillar write word line.

2. The MRAM of claim 1, wherein each of the sidewall keepers is in contact with the corresponding pillar write word.

3. The MRAM of claim 1, wherein each of the pillar write word lines extends in a vertical direction, an upper end of each of the pillar write word lines being in contact with a corresponding one of the upper layer write word lines, a lower end of each of the pillar write word lines being in contact with the lower layer write word line.

4. The MRAM of claim 1, wherein the sidewall keeper is made of a Permalloy magnet.

5. The MRAM of claim 1, further comprising a plurality of bit lines extending along the second direction, wherein the upper layer write word lines are substantially parallel to the bit lines.

6. The MRAM of claim 5, wherein the lower layer write word lines of two immediately adjacent magnetic memory units along the first direction are not aligned with each other in the first direction.

7. The MRAM of claim 6, wherein each of the lower layer write word lines has a first end and a second end opposite to the first end, the lower layer write word lines of two immediately adjacent magnetic memory units along the first direction being partially overlapped in the first direction, such that a length from the first end of one of the lower layer write word lines of the two immediately adjacent magnetic memory units to the second end of the other one of the lower layer write word lines of the two immediately adjacent magnetic memory units is less than a sum of a length of the respective lower layer write word lines of the two immediately adjacent magnetic memory units.

8. The MRAM of claim 7, wherein the upper layer write word lines of two immediately adjacent magnetic memory units along the second direction are aligned with each other in the second direction.

9. The MRAM of claim 1, wherein the lower layer write word lines of two immediately adjacent magnetic memory units along the first direction are not aligned with each other in the first direction.

10. The MRAM of claim 1, wherein each of the lower layer write word lines has a first end and a second end opposite to the first end, the lower layer write word lines of two immediately adjacent magnetic memory units along the first direction being partially overlapped in the first direction, such that a length from the first end of one of the lower layer write word lines of the two immediately adjacent magnetic memory units to the second end of the other one of the lower layer write word lines of the two immediately adjacent magnetic memory units is less than a sum of a length of the respective lower layer write word lines of the two immediately adjacent magnetic memory units.

11. The MRAM of claim 1, wherein the upper layer write word lines of two immediately adjacent magnetic memory units along the second direction are aligned with each other in the second direction.

* * * * *